(12) United States Patent
Lam et al.

(10) Patent No.: US 6,389,376 B1
(45) Date of Patent: May 14, 2002

(54) METHOD AND APPARATUS FOR GENERATING N-SEGMENT STEINER TREES

(75) Inventors: William Lam, Fremont; Zhaoyun Xing, San Jose, both of CA (US)

(73) Assignee: Sun Microsystems, Inc., Palo Alto, CA (US)

( * ) Notice: Subject to any disclaimer, the term of this patent is extended or adjusted under 35 U.S.C. 154(b) by 0 days.

(21) Appl. No.: 09/360,339

(22) Filed: Jul. 26, 1999

(51) Int. Cl.$^7$ ............................................... G06F 17/10
(52) U.S. Cl. ......................................................... 703/2
(58) Field of Search .................. 257/206, 208, 257/300, 315, 369, 401, 758; 438/197; 700/97, 121; 716/3, 6, 8, 9, 10.5, 13, 14, 18; 395/500.23

(56) References Cited

U.S. PATENT DOCUMENTS

| | | | | |
|---|---|---|---|---|
| 5,491,641 A | * | 2/1996 | Scepanovic et al. | 716/13 |
| 5,587,923 A | * | 12/1996 | Wang | 716/13 |
| 5,717,229 A | * | 2/1998 | Zhu | 257/208 |
| 5,805,462 A | * | 9/1998 | Poirot et al. | 716/18 |
| 6,086,626 A | * | 7/2000 | Jain et al. | 716/5 |
| 6,132,980 A1 | * | 11/2001 | Rostoker et al. | 438/197 |

OTHER PUBLICATIONS

Huibo Hou et al., "Non–Hanan routing", Transactions on Computer aided design of Integrated circuits and systems, Apr. 1999.*
Haiyun Bao, et al., "A new global routing algorithm independent of net ordering", Design Automation Conference, 1999.*
Shin–ichi Minato et al., "Shared Binary decision diagram with attribute edges for efficient Boolean function manipulation", 27th ACM/IEEE Design Automation Conference, 1990.*
Randal E. Bryant, Graph–Based Algorithms for Boolean Function Manipulation, IEEE Transactions on Computers, Aug. 1986, pp. 677–691, vol. C–35, No. 8.

* cited by examiner

Primary Examiner—Kevin J. Teska
Assistant Examiner—Kandasamy Thangavelu
(74) Attorney, Agent, or Firm—The Hecker Law Group (57) ABSTRACT

The invention is a method and apparatus for generating one or more Steiner trees representing a connection of at least two points. In accordance with an embodiment of the method, a Boolean network function is generated which represents a network of interconnects connecting the at least two points. A binary decision diagram (BDD) for the Boolean network function is generated, the BDD having a root and at least one variable node. The number of vertices for at least one variable node of the BDD is determined. The solution values for one or more of the variables of the Boolean network function are determined in accordance with a path(s) through the BDD from the root to one or more of the variable nodes. In one embodiment, the Boolean network function represents interconnects in an encoded space containing the points to be connected, the interconnects having no greater than "n" segments and arranged to join at a joint. In accordance with this embodiment, the solution values yielded by the BDD path(s) comprise the coordinates of the interconnect joint.

19 Claims, 5 Drawing Sheets

METHOD AND APPARATUS FOR GENERATING N-SEGMENT STEINER TREES

BACKGROUND OF THE INVENTION

1. Field of the Invention

This invention relates to a method and apparatus for generating one or more n-segment Steiner trees, the trees representing minimal manhattan-space distance connections avoiding obstacles.

2. Background Art

The design of a circuit involves both identifying circuit components necessary to accomplish one or more functions and determining a physical arrangement of the identified circuit components. It is generally desirable to find an optimal circuit design which minimizes the size and cost of the circuit and maximizes the speed and efficiency of the circuit.

Optimization of the circuit components which are to comprise a circuit is generally accomplished in the Boolean domain. Circuit components for generating the desired circuit function are represented by one or more Boolean operators, such as AND/XOR etc., each operator or combination of operators representing an electronic "gate" or component. Once the components of a desired circuit have been represented with the appropriate Boolean operators, it is possible to optimize the circuit using the known laws of Boolean algebra. Application of these laws may permit the various Boolean operators representing the circuit to be reconfigured, such as by lessening the total number of operators (and hence circuit components) needed to create the desired circuit. The various operators of the optimized Boolean operator set are then converted back into corresponding real circuit components, i.e. transistors, diodes, etc.

Once the circuit components are known, the layout of these components is performed in the real domain (i.e. non-Boolean domain). The various components may be mapped into Cartesian coordinates and moved around until their arrangement is optimized. As part of this layout process, an arrangement for the interconnections of the components must also be determined.

For example, in submicrocircuit design, electronic gates are connected with microstrips. The speed of the circuit is at least partially dependent upon the length of the microstrips between gates, as in general the electronic signal time delay of a particular gate is approximately equal to the delay associated with the traversal of the signal through the interconnect between gates. As such, in the design of such a circuit, an objective is to arrange the gates or terminals of the circuit so that they are connected with a minimum length of microstrip lines.

The network of microstrips or lines which connects the components or gates is generally referred to as a Steiner tree. As stated above, it is desirable for the Steiner tree to have a minimum total length. Generally, the Steiner tree is developed in real Euclidian space, with the limitation that the lines forming the tree and connecting the components follow rectilinear coordinates.

A significant problem associated with this method of circuit design is that the circuit component determination and component layout portions of the design phase are performed independently. As a result, optimal circuit design conditions which are achieved in one portion of the design phase may be destroyed in a later portion of the design phase. As an example of this problem, the optimal choice of circuit components might differ if it were possible to consider the layout or arrangement of the components at the same time as the possible combinations of the components.

A source of this problem is that the two portions of the design phase are performed independently, the circuit component portion of the design phase being performed in the Boolean domain and the layout portion performed in the real domain.

SUMMARY OF THE INVENTION

The invention is a method and apparatus for generating n-segment Steiner trees connecting two or more points. In one or more embodiments, the Steiner tree represents an interconnect of two or more points in space, such as a microstrip connection of terminals of a component.

One embodiment of the invention comprises a method comprising the following steps: generating a Boolean network function representing a network of interconnects, each interconnect having as an end point one of said at least two points; determining a binary decision diagram for the Boolean network function; and determining a Steiner tree by determining solution values for the Boolean network function in accordance with the binary decision diagram. In one or more embodiments, the Boolean network function represents a network of interconnects having "n" segments.

In one or more embodiments, the step of determining a binary decision diagram includes the step of determining a number of vertices corresponding to at least one variable node of the diagram, and the step of determining solution values comprises the step of selecting a path from a root of the binary decision diagram to a variable node. In one embodiment, an optimal Steiner tree solution is determined by determining solution values from a path from the root to a variable node having the least number of vertices.

In one or more embodiments, the Boolean network function is generated from individual Boolean interconnect function for interconnects corresponding to each point to be connected, the interconnects all joining at a common joint. In one or more embodiments, the solution value yielded is the coordinates of the joint of the interconnects and the Steiner tree is determined from the joint and coordinate points.

One or more embodiments of the invention comprise a hardware and/or software for generating one or more Steiner trees forming the connection of two or more points.

Further objects, features and advantages of the invention will become apparent from the detailed description of the drawings which follows, when considered with the attached figures.

BRIEF DESCRIPTION OF THE DRAWINGS

FIG. 3(*a*) illustrates a Steiner tree connecting the points A,B, and C in the arrangement illustrated in FIG. 3;

DETAILED DESCRIPTION OF THE INVENTION

The invention is a method and apparatus for generating n-segment Steiner trees connecting two or more points. In the following description, numerous specific details are set forth in order to provide a more thorough description of the present invention. It will be apparent, however, to one skilled in the art, that the present invention may be practiced without these specific details. In other instances, well-known features have not been described in detail so as not to obscure the invention.

Portions of the disclosure of this patent document may contain material that is subject to copyright protection. The copyright owner has no objection to the facsimile reproduction by anyone of the patent document or the patent disclosure as it appears in the Patent and Trademark Office file or records, but otherwise reserves all copyright rights whatsoever. Java™ is a trademark or registered trademark of Sun Microsystems, Inc. in the United States and other countries. All SPARC™ trademarks are used under license and are trademarks or registered trademarks of SPARC International in the United States and other countries. Products bearing SPARC trademarks are based upon an architecture developed by Sun Microsystems, Inc.

Method For Generating n-Segment Steiner Trees

One or more embodiments of the invention comprise a method for generating n-segment Steiner trees representing the connection of at least two points. In one or more embodiments, the method may be utilized to determine a connection between terminals or components of a circuit.

As used herein, the term "Boolean domain" is intended to mean that mathematical domain closed over the values of zero (0) and one (1), the domain including a variety of operations which may be performed on or with these values, generally known as Boolean algebraic operations. These Boolean operations, such as "OR" "AND" "NOT" and "NAND" are well known, as are the rules, theorems, postulates of Boolean algebra. The term "Boolean function" as used herein means a function in the Boolean domain.

The term "real function" or "real-value function" as used herein is intended to mean a function which is not exclusively in the Boolean domain. For example, a real-value function may comprise values other than zero (0) and one (1), and may include operations other than Boolean algebra operations.

The term "Steiner-tree" is intended to mean a real or imaginary interconnect connecting two or more points. For example, a Steiner-tree may comprise one or more lines which connect two or more points. The lines may be imaginary, or be real, in the case of one or more physical "leads" or microstrips connecting electronic components or terminals.

One embodiment of a method of the invention will be described with reference to FIG. 1. A first step S1 comprises generating or deriving a Boolean network function representing a network of interconnects, where an interconnect is provided corresponding to each point to be connected by the Steiner tree and each interconnect has "m" turns the Steiner tree has "n"-segments. The particular Boolean network function is dependent upon the particular real problem to be solved.

Figure 3A:
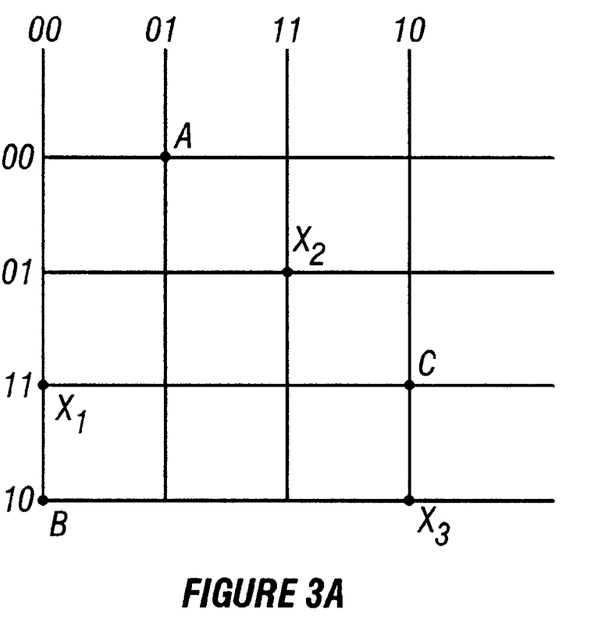
Figure 3B:
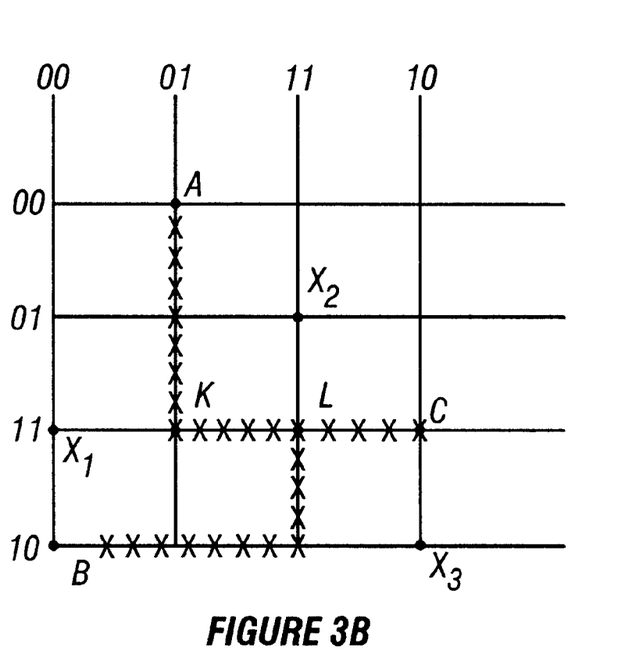
FIG. 3 illustrates a Manhattan grid with points A, B and C to be connected with a Steiner tree and obstacles X1, X2 and X3 to be avoided.

The terms "n-segment" and "m"-turns will be described with reference to FIG. 3. As illustrated therein, a problem is presented where it is desired to connect points A, B and C with a Steiner tree, but avoiding obstacles X1, X2 and X3. One such Steiner tree is illustrated in FIG. 3(*a*) (the Steiner tree connections are illustrated therein by the paths covered with "x's"). First, a joint J of the Steiner tree which connects the points may be defined as a point on the Steiner tree such that when considering the number of turns along each path connecting the joint J and any point P on the Steiner tree, the path having the maximum number of turns achieves the minimum or lowest number of total turns. For any such joint J, the maximum number of turns along any path connecting the joint J and any point P on the Steiner tree is "m," and J is called an "m"-turn joint. The number of segments "n" for any such path has a value of one (1) greater than the number of turns, i.e. n=m+1. A resulting Steiner tree has "n"-segments totalling the individual segments along each path.

There may be more than one joint J for a particular Steiner tree. Referring to FIG. 3(*a*) again, point L is a joint while point K is not, because the maximum number of turns for a segment or path from K to another point on the Steiner tree is 2 (i.e. the path from point K to point B), while the maximum number of turns for a segment or path from point L to any other point on the Steiner tree is 1. It may also now be understood that a collection of points is "m"-turn connectable if there exists a joint J for which all connections may be made with a minimum maximum number of "m" turns or "n" segments.

Figure 2:
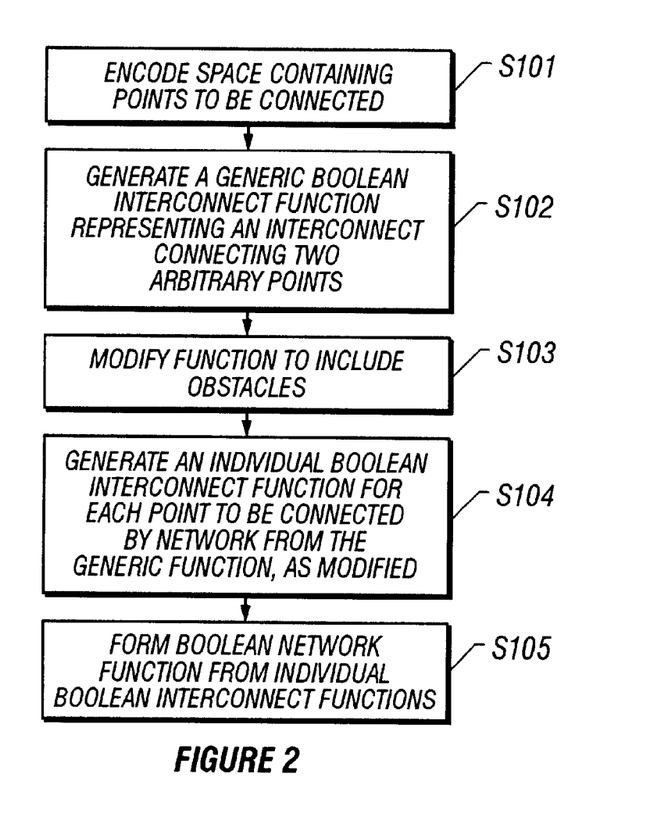
FIG. 2 is a flow diagram illustrating in detail one embodiment of a step S1 of the method illustrated in FIG. 1.

There are a variety of ways for deriving a Boolean function which represents a certain real value function. Sub-steps representing one embodiment of a method for generating a Boolean network function representing a real-value network problem will be described with reference to FIG. 2.

In one or more embodiments, the Boolean network function generated in step S1 represents an interconnect having one or more segments, connecting two or more points, such as components or terminals of a circuit, and which avoids obstacles, if any, and which satisfies other constraints, if any.

FIG. 3 graphically illustrates such a real-value problem where it is desired to connect terminals or points A, B, and C with a Steiner tree having segments which extend in real Manhattan space and which avoids obstacles X1, X2 and X3. By "Manhattan" space it is meant a space defined by horizontal and vertical grid of lines extending perpendicular to one another. In this space, points may only lie on the grid lines.

In a first sub-step S101, the "real" space in which the points to be connected (such as terminals) and obstacle(s) (if any) lie is encoded so that each point and obstacle has a unique identifier. In the situation where the points and obstacles are constrained to a Manhattan grid, the grid space is binary-coded, i.e. coded with coordinates comprising only combinations of the value one (1) and zero (0). An example of this encoding is illustrated in FIG. 3 (where values in the horizontal or "x" direction and values in the vertical or "y"

direction are each given values of 00, 01, 10, or 11, and each point on the grid may be defined by its "x" and "y" coordinates in four bits: (P1,P2,P3,P4).

In one or more other embodiments, the space is "Grey-code" encoded. Grey-code has the characteristic that adjacent nodes or vertices of a gridded space differ in only one bit, each bit comprising only values of one (1) or zero (0) (i.e. each coordinate of the Grey-coded space is represented by combinations of the binary values one (1) and zero (0)). The Grey-code of a point (x,y) in the space is obtained by concatenating the codes of the x and y coordinates, i.e. coordinates (x,y)=code(x)code(y). Grey-coding of coordinates in this manner is well-known. For example, when the grid is small, having only coordinates for x and y points as (0,0) (0,1) (1,0) and (1,1), the coordinates of each point can be represented by a two-bit Grey-code, such as (0,1) (1,1) or the like, where the first bit represents the "x"-axis value and the second bit the "y"-axis value. When the grid is larger, the number of bits necessary to represent the coordinates is correspondingly larger. For example, the particular coordinates of a point may comprise (0010111), where the first four bits (0010) represent the "x"-axis coordinate and the last three bits (111) represent the "y"-axis coordinate.

Next, in a step S102, a Boolean interconnect function is derived which represents an "n"-segment interconnect. This Boolean interconnect function F may be said to have three variables R, S and P, where R and S represent end-points of the interconnect and P;represents a point on the interconnect.

Next, in a step S103, this "generic" function is modified to avoid obstacles or other constraints, if any exist. In the case illustrated in FIG. 3, this means the function must be modified to avoid the obstacles X1, X2 and X3. This modified function Fm(R,S,P) may be represented as follows:

Fm(R,S,P)=F(R,S,P)!F(R,S,X)=F(R,S,P){(!F(R,S,X1)!F(R,S,X2)!F(R,S,X3)},

The function !F(R,S,X) is the Boolean "NOT" of the function F(R,S,X), which is a Boolean function modified to include the obstacle. The expression F(R,S,P) evaluates to 1 if an "n"-segment interconnect connecting the points exists, and !F(R,S,X) is 1 (or F(R,S,X) is 0) when the obstacle X is not on the interconnect or does not lie along the interconnect connecting the points R and S.

The function Fm(R,S,P) set forth above is a Boolean function representing a "1"-segment (i.e. n=1 and thus m=0 (i.e. there are no turns)) interconnect which connects to points R and S and which avoids obstacles X1, X2 and X3. In some instances, a Steiner tree solution may exist for a real problem where each of the interconnects has no turns. Then, the method proceds as set forth below in step S103. In many instances, however, such a solution will not exist. For example, in the case illustrated in FIG. 3 it is visually obvious that there is no combination of no-turn connections (i.e. straight lines) which will connect all three points A, B and C. In such an instance, it is necessary to further modify the "generic" Boolean function to represent an "n"-segment interconnect where "n" is greater than 1.

Figure 1:
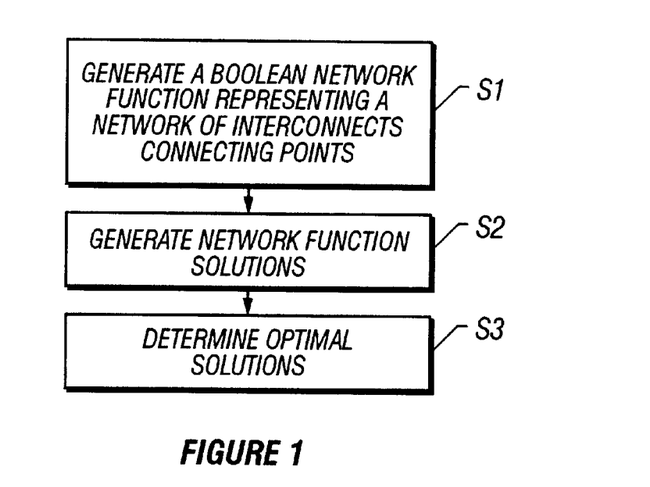
FIG. 1 is a flow diagram illustrating one embodiment of a method of the invention.

It may be desirable to determine if a solution to the real problem exists in accordance with the steps illustrated in FIG. 1 in the first instance using a Boolean function with "n" equal to one (1). Then, if a solution is not yielded, the process or method illustrated in FIG. 1 (and described further below) may be repeated by modifying the Boolean function generated in step S1 where "n" is increased. In one or more embodiments, in each iteration "n" is increased by a value of one (1).

In the example illustrated in FIG. 3, since it is known that a solution will not be yielded for one-segment interconnects, the above-referenced Boolean interconnect function Fm(R, S, P) is modified to represent a two-segment interconnect (i.e. n=2, such that the interconnect has one turn).

In the case where each interconnect has two (2) segments, the segments must connect at a connecting or turning point T. This function may be represented as follows:

$$Fm2(R,T,S,P)=\{Fm(R,T,P)+Fm(T,S,P)\}Fm(R,T,T)Fm(T,S,T)$$

In this equation, the first term {Fm(R,T,P)+Fm(T,S,P)} represents the two segments from point R to turning point T and turning point T to point S. The second term Fm(R,T,T) Fm(T,S,T) is "ANDed" with the first term and insures that the two segments are connected at the turning point T.

This function may be simplified to remove variables(s) for which solutions are not necessary. It is desireable only to know if there exists a solution to the problem for any values (R,S,P) and it is not necessary to determine turning point T. The variable T may be removed from the equation as follows. First, turning point T may be represented by its individual coordinate components. In the case illustrated in FIG. 3, the coordinates for point T may be represented as T=(T0,T1,T2,T3), where T0 and T1 comprise the vertical or "y" coordinate component and T2 and T3 comprise the horizontal or "x" coordinate component. Fm2(R,T,S,P) becomes Fm2(R,T0,T1,T2,T3,S,P). The "T" component of the equation may then be removed one bit at a time:

$$\exists(R,S,P)(Fm2a(R,T1,T2,T3,S,P))=\exists(R,S,P)(Fm2(R,T0=0,T1,T2,T3,T4,S,P)+Fm2(R,T0+1,T1,T2,T3,T4,S,P))$$

$$\exists(R,S,P)(Fm2b(R,T2,T3,S,P))=\exists(R,S,P)(Fm2a(R,T1=0,T2,T3,S,P)+Fm2a(R,T1=1,T2,T3,S,P))$$

$$\exists(R,S,P)(Fm2c(R,T3,S,P))=\exists(R,S,P)(Fm2b(R,T2=0,T3,S,P)+Fm2b(R,T2=1,T3,S,P))$$

$$\exists(R,S,P)(Fm2d(R,S,P))=\exists(R,S,P)(Fm2c(R,T3=1,S,P)+Fm2c(R,T3=1,S,P))$$

Where "$\exists$" is an existential operator.

Next, in a step S103, an individual Boolean interconnect function is generated representing an "n"-segment interconnect for each specific point which is to be connected with the Steiner tree. In the case illustrated in FIG. 3, an individual Boolean interconnect function is thus generated for an "n"-segment interconnect which has as one endpoint point A, an individual Boolean interconnect function is generated for an "n"-segment interconnect which has as one endpoint point B, and yet another individual Boolean function is generated for an "n"-segment interconnect which has as one endpoint point C.

Each of the interconnects including these individual points must ultimately be a part of a single Steiner tree, and must interconnect. The individual interconnect functions are further constrained to join at a point J. This point J is a joint (having the properties described above) of the Steiner tree, with all interconnects leading from point J to the points A, B and C to be connected having no more than "n"-segments or "m"-turns.

The individual interconnect functions corresponding to each point to be connected may be obtained by substitution in the generic Boolean interconnect function Fm2d(R,S,P) having generic endpoints points R and S as set forth above. A first function F(A,J,P) is derived from the previously defined Boolean function F(R,S,P) by substituting point A for R and J for S. Another function F(B,J,P) is derived from the previously defined function F(R,S,P) by substituting point B for R and point J for S. The function F(C,J,P) is derived from the function F(R,S,P) by substituting point C for R and point J for S.

In a sub-step S104 a Boolean network function representing a network of the interconnects is generated. In one or more embodiments, this network function is generated from the individual Boolean interconnect functions (in the case illustrated in FIG. 3, the interconnect functions for points A, B and C).

In the example illustrated in FIG. 3, the resultant Boolean network function representing a network of interconnects or lines connecting points A, B and C, all having a common joint J, and on which a point P falls may be represented as:

$$F(J,P)=\{F(A,J,P)+F(B,J,P)+F(C,J,P)\}\{F(A,J,J)F(B,J,J)F(C,J,J)\}$$

The first part of this equation $\{F(A,J,P)+F(B,J,P)+F(C,J,P)\}$ is the Boolean OR of the represented line segments, and is satisfied (i.e. evaluates to 1) only if point P lies on any or all of the interconnect segments. This result is Boolean "ANDed" with the term $\{F(A,J,J)F(B,J,J)F(C,J,J)\}$, this term forcing the interconnect segments F(A,J,J), F(B,J,J) and F(C,J,J) to interconnect at joint J.

Figure 4:
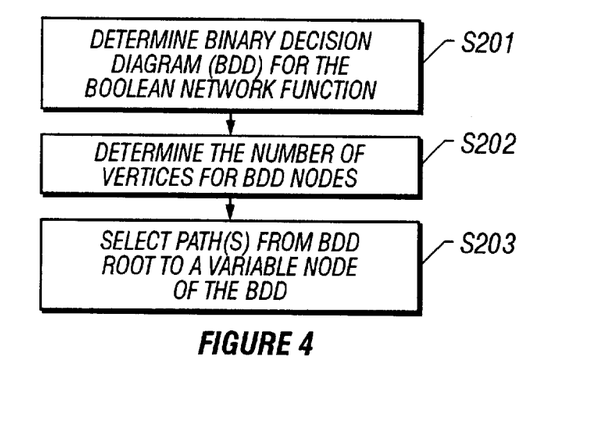
FIG. 4 is a flow diagram illustrating in detail one embodiment of a step S4 of the method illustrated in FIG. 1.

Referring now to FIG. 1 again, in a step S2, one or more solutions (if any exist) are generated for the function Boolean function representing the network of interconnects forming the Steiner tree. FIG. 4 illustrates sub-steps comprising one embodiment of a method for generating the solutions for the function.

In a first sub-step S201, a binary decision diagram (BDD) is generated for the Boolean function. Binary decision diagrams are well known to those of skill in the art, and are described in greater detail in *Graph-Based Algorithms for Boolean Function Manipulation* by R. E. Bryant, IEEE Transaction on Computers, Vol. C-35 No. 8, August 1986 (pgs. 677–690).

In general, a binary. decision diagram (BDD) is a directed acyclic graph of a Boolean function. The binary decision diagram has one root node and leaves or constant nodes comprising the Boolean constants zero (0) and one (1). The non-leaf nodes of the graph (including the root node) are nodes comprising variables of the Boolean function. Each non-leaf node has outgoing paths labelled zero (0) and one (1) leading to another node. In general, the diagram is illustrated such that the right-hand branch leading from a variable node is assigned a value of one (1), and the left-hand branch leading from a variable node is assigned a value of zero (0).

The result (i.e. output value) of the function is determined by following a path from the root through the variable(s) to one of the leaves, with the resultant function value equal to the value of the leaf (i.e. 0 or 1).

In one or more embodiments of the invention, the binary decision diagram is structured or ordered such that the root comprises a first of the variables for which a solution value is desired. Under the root, the remaining variable nodes are ordered first with those other variables for which a solution value is desired ("solution variables"), and then the variables for which no solution value is necessary ("set variables"), and finally with the constant nodes forming the leaves.

Figure 5:
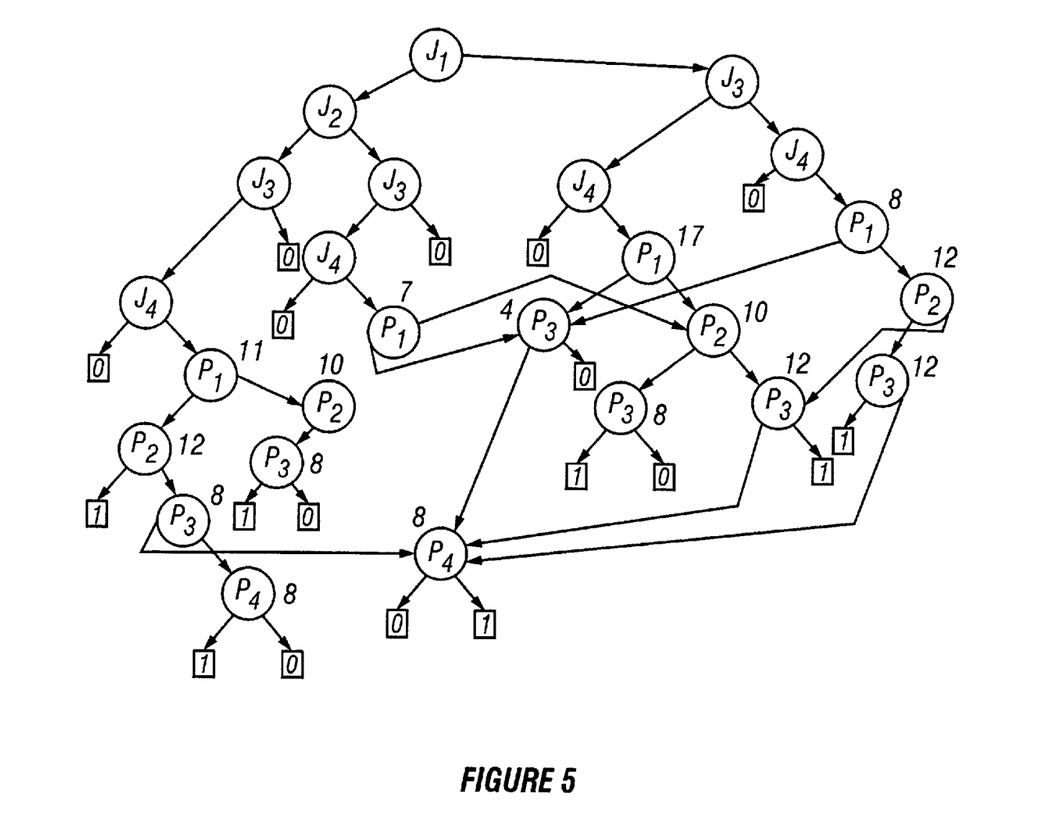
FIG. 5 illustrates a binary decision diagram for a particular Boolean function.

FIG. 5 illustrates the binary decision diagram for a Boolean function representing the interconnect function F set forth above for the real-value problem graphically illustrated in FIG. 3.

In accordance with this function, one desires to determine the values J1, J2, J3 and J4, since these values yield the Grey-code coordinates of the joint J of the interconnects or lines forming the Steiner tree. It is not necessary to determine the values of P1, P2, P3 and P4 and as such these variables comprise the "set" variables. As such, the binary decision diagram is arranged with the root forming one of the variable nodes J1, J2, J3 or J4 (in the illustration, J1 has been chosen as the root), then the other of the variable nodes for which a solution value is desired (J2, J3 and J4 in the illustrated example), then the set variables (P1, P2, P3 and P4) and then the leaves.

In a step S202, the number of vertices for the leaves and nodes of the binary decision diagram are computed or determined. The number of vertices may be calculated in accordance with the following. In a binary decision diagram representing a Boolean function of "n" variables, the number of vertices is $2^n$ for the constant or "leaf" node having a value of one (1) and zero (0) for the constant or "leaf" node having a value of zero (0). The sum of the vertices of the left and right children divided by two (2) (i.e. (L+R)/2) for variable nodes having left and right child nodes (child nodes are nodes at the terminus of branches leading from a particular node).

The step of calculating the vertices of the nodes has the effect of merging the Boolean function with the real domain problem or functions and permits a solution of the Boolean function to provide a solution to the real problem. In addition, this effect also permits one to determine the optimal solution(s) of the real problem, as described below.

The number of vertices at each variable and leaf node may be calculated manually or with a computer of the like. Referring to FIG. 5, the number of vertices at the variable nodes and of the constant leaf nodes have values of zero (0) and one (1) are indicated adjacent to each node.

In a step S203, solutions for the Steiner tree are determined from paths from the root of the binary decision diagram to a set variable node, if any such paths exist. If no paths exist, then there is no solution for that particular function.

In the example illustrated in FIG. 5, multiple paths lead from the root node (J1) to a variable node (i.e. a node corresponding to P1, P2, P3 or P4). Thus, in this case, there are multiple solutions for the function, thus providing corresponding Steiner trees connecting each of the points and avoiding the obstacles.

Referring to FIG. 5, the solution(s) to the real function is/are determined from the path(s). In the above-referenced example, a path leading from the root node (J1) along the right branch to the node J3, then along the left branch from node J3 to node J4, and then along the right branch from node J4 to variable node P1 (having seven (7) vertices) provides one solution. It is noted that in this particular case, the right-hand side (leading from the root node J1) of the binary decision diagram does not include a node J2. This means that any value of J2 will provide a solution to the function.

The above-described path yields a solution for the joint J as having real coordinates (11,01) and (10,01). These solutions are provided by the values associated with the path from each node. J1 has a value of one (1) moving along the right branch therefrom. J3 has a value of zero (0) moving along the left branch therefrom, and J4 has a value of one (1) moving along the right branch therefrom. Notably, there are two solutions since J2 can have a value of either zero (0) or (1). As described above, the values for J1 and J2 represent the "Y" coordinate values of the joint J and the values J3 and J4 represent the "X" coordinate values for the joint J.

Figure 6:
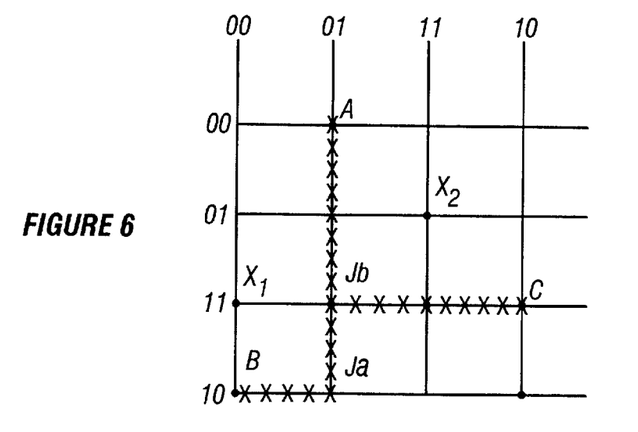
FIG. 6 illustrates one Steiner tree solution for the problem illustrated in FIG. 3.

The Steiner tree corresponding to these two solutions is illustrated in FIG. 6. In accordance with the first solution, the Steiner tree connects the points A, B and C and has a joint Ja located at (11,01). In accordance with a second solution, the Steiner tree connects the points A, B and C and has joint Jb located at (10,01). In both cases, it is known that the Steiner tree contains seven vertices because the variable node P1 has a vertex value of seven (7). In the first case, these vertices comprise the points A, B, C, Ja, and the points (11,01), (11,11) and (10,01). In the second case, these vertices comprise the points A, B, C, Jb and the points (11,11), (10,01) and (01,01). In addition, because a solution was yielded for the Boolean network function when "m" for each interconnect comprised one (1), it is known that there is no more than one "turn" along each interconnect path from the joint J to each of the points A, B, and C to be connected.

Another solution is yielded by the path from the root node J1) along the right branch from root node J1 to node J3, along the right branch from node J3 to J4, and along the right branch to set variable node P1. This path yields two solutions for the joint J as having coordinates (11,11) and (10,11) (again, there are two solutions because variable J2 may have a value of either one (1) or zero (0)).

Figure 7:
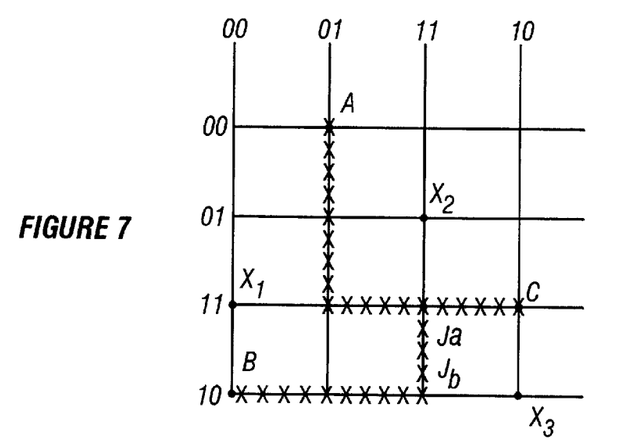
FIG. 7 illustrates another Steiner tree solution for the problem illustrated in FIG. 3.

The Steiner tree corresponding to these solutions is illustrated in FIG. 7. In accordance with a first of these solutions, a Steiner tree connects the points A, B and C and has a joint Ja located at (11,11). In accordance with a second of these solutions, a Steiner tree connects points A, B and C and has a joint Jb located at (10,11). In both cases it is known that the Steiner tree contains eight vertices because the variable node P1 has a vertex value of eight (8). In the first case, these vertices comprise the points A, B, C, Ja, and the points (01,01), (11,01), (10,11) and (10,01), and in the second case, these vertices comprise the points A, B, C, Jb and the points (01,01), (11,01), (11,11) and (10,01).

Yet another solution is yielded by the path from the root node (J1) along the left branch to node J2, along the left branch to node J3, along the left branch to node J4, and along the right branch to variable node P1. This solutions yields coordinates for joint J as (00,01).

Figure 8:
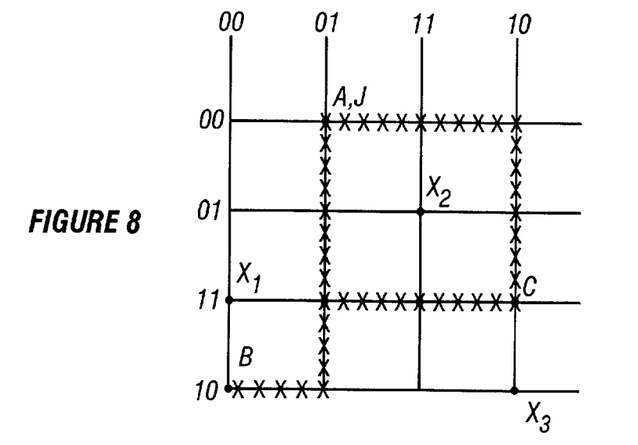
FIG. 8 illustrates yet another Steiner tree solution for the problem illustrated in FIG. 3.

The Steiner tree corresponding to these solutions is illustrated in FIG. 8. In accordance with a first of these solutions, a Steiner tree connects the points A, B and C and has a joint J located at the same point as A: (00,01). In this case it is known that the Steiner tree contains eleven (11) vertices because the variable node P1 has a vertex value of eleven (11).

Referring again to FIG. 1, in a step S3, the optimal Steiner tree is determined. As used herein, the term "optimal Steiner tree" is meant to be an interconnect connecting all points to be connect and having the shortest length. The optimal Steiner tree is determined from the binary decision diagram by selecting the path through the diagram which leads to the variable node having the smallest number of vertices (in the above-referenced example, the optimal solution is illustrated in FIG. 6, where the total number of vertices is seven (7)). When the number of interconnects or vertices is minimized, then the total length of the Steiner tree is minimized, since the total interconnect length is proportional to the number of vertices or turns.

Advantageously, the method described above not only yields all n-segment Steiner trees interconnecting the desired points, avoiding obstacles, and otherwise satisfying desired criteria (in this case, these criteria included that the interconnect segments extend along the Manhattan grids), but also will yield the Steiner tree(s) which are optimal in the sense of having the shortest interconnect length.

In the example illustrated and described above, solutions were yielded when the value of "n" comprised two (2) and thus each interconnect had at most one (1) turn. In the cases where "n" is larger, the Boolean functions include variables representing additional turn points, and the binary decision diagram includes nodes for those variables. For example, if the value "n" is selected as three (3), then each interconnect may comprise three segments joined at a two points, such as T and Y.

Those of skill in the art will appreciate that the number of vertices need not be calculated directly for each and every node of the binary decision diagram. All that is necessary is the calculation of the number of vertices for the nodes that form a terminus of one of the shortest path(s). Further, though the binary decision diagram is termed a "diagram," this ordering of the variable and constant nodes need not be done graphically or visibly, but can be done in a variety of manners, such as electronically by a computer.

As described above, the method of the invention is not limited to the specific examples given above. For example, the method may be utilized to determine the shortest path between objects which are of arbitrary shape (and not necessarily having as their boundaries Manhattan grids).

Embodiment of Computer Execution Environment (Hardware)

Figure 9:
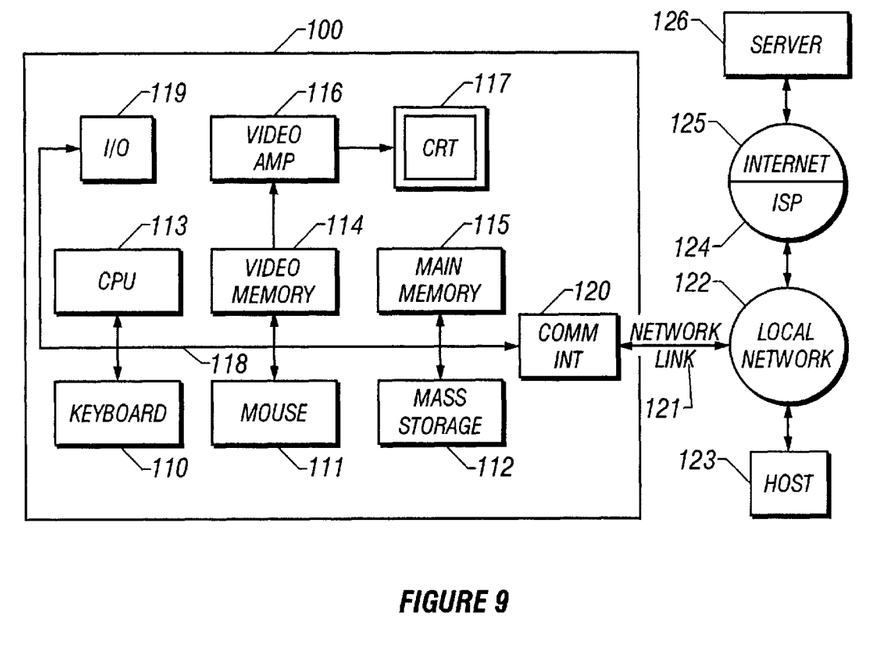
FIG. 9 is a block diagram of one embodiment of a computer system capable of providing a suitable execution environment for an embodiment of the invention.

An embodiment of the invention can be implemented as computer software in the form of computer readable code executed on a general purpose computer such as computer 100 illustrated in FIG. 9, or in the form of bytecode class files executable within a Java™ runtime environment running on such a computer, or in the form of bytecodes running on a processor (or devices enabled to process bytecodes) existing in a distributed environment (e.g., one or more processors on a network). A keyboard 110 and mouse 111 are coupled to a system bus 118. The keyboard and mouse are for introducing user input to the computer system and communicating that user input to processor 113. Other suitable input devices may be used in addition to, or in place of, the mouse 111 and keyboard 110. I/O (input/output) unit 119 coupled to system bus 118 represents such I/O elements as a printer, A/V (audio/video) I/O, etc.

Computer 100 includes a video memory 114, main memory 115 and mass storage 112, all coupled to system bus 118 along with keyboard 110, mouse 111 and processor 113. The mass storage 112 may include both fixed and removable media, such as magnetic, optical or magnetic optical storage systems or any other available mass storage technology. Bus 118 may contain, for example, thirty-two address lines for addressing video memory 114 or main memory 115. The system bus 118 also includes, for example, a 64-bit data bus for transferring data between and among the components, such as processor 113, main memory 115, video memory 114 and mass storage 112. Alternatively, multiplex data/address lines may be used instead of separate data and address lines.

In one embodiment of the invention, the processor 213 is a microprocessor manufactured by Sun Microsystems, Inc., such as the SPARC™ microprocessor, or a microprocessor manufactured by Motorola, such as the 680X0 processor, or a microprocessor manufactured by Intel, such as the 80X86, or Pentium processor. However, any other suitable microprocessor or microcomputer may be utilized. Main memory 115 is comprised of dynamic random access memory (DRAM). Video memory 114 is a dual-ported video random access memory. One port of the video memory 114 is coupled to video amplifier 116. The video amplifier 116 is used to drive the cathode ray tube (CRT) raster monitor 117. Video amplifier 116 is well known in the art and may be implemented by any suitable apparatus. This circuitry converts pixel data stored in video memory 114 to a raster signal suitable for use by monitor 117. Monitor 117 is a type of monitor suitable for displaying graphic images.

Computer 100 may also include a communication interface 120 coupled to bus 118. Communication interface 120 provides a two-way data communication coupling via a network link 121 to a local network 122. For example, if communication interface 120 is an integrated services digital network (ISDN) card or a modem, communication interface 120 provides a data communication connection to the corresponding type of telephone line, which comprises part of network link 121. If communication interface 120 is a local area network (LAN) card, communication interface 120 provides a data communication connection via network link 121 to a compatible LAN. Wireless links are also possible. In any such implementation, communication interface 120 sends and receives electrical, electromagnetic or optical signals which carry digital data streams representing various types of information.

Network link 121 typically provides data communication through one or more networks to other data devices. For example, network link 121 may provide a connection through local network 122 to local server computer 123 or to data equipment operated by an Internet Service Provider (ISP) 124. ISP 124 in turn provides data communication services through the world wide packet data communication network now commonly referred to as the "Internet" 125. Local network 122 and Internet 125 both use electrical, electromagnetic or optical signals which carry digital data streams. The signals through the various networks and the signals on network link 121 and through communication interface 120, which carry the digital data to and from computer 100, are exemplary forms of carrier waves transporting the information.

Computer 100 can send messages and receive data, including program code, through the network(s), network link 121, and communication interface 120. In the Internet example, remote server computer 126 might transmit a requested code for an application program through Internet 125, ISP 124, local network 122 and communication interface 120.

The received code may be executed by processor 113 as it is received, and/or stored in mass storage 112, or other non-volatile storage for later execution. In this manner, computer 100 may obtain application code in the form of a carrier wave.

Application code may be embodied in any form of computer program product. A computer program product comprises a medium configured to store or transport computer readable code, or in which computer readable code may be embedded. Some examples of computer program products are CD-ROM disks, ROM cards, floppy disks, magnetic tapes, computer hard drives, servers on a network, and carrier waves.

The computer systems described above are for purposes of example only. An embodiment of the invention may be implemented in any type of computer system or programming or processing environment.

Figure 10:
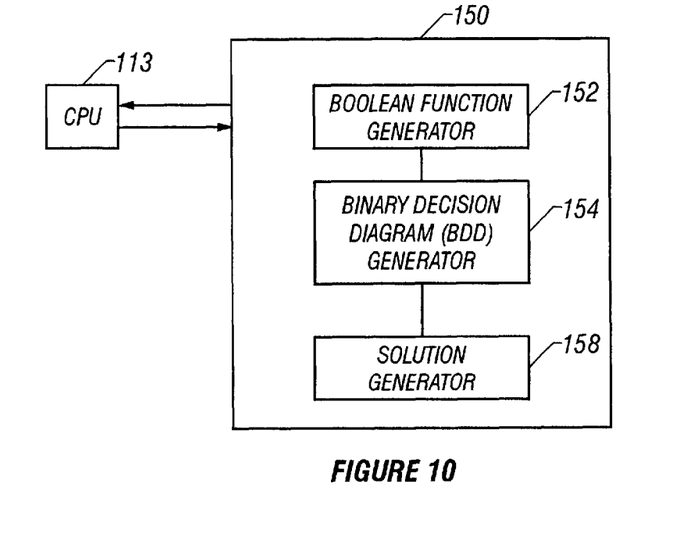
FIG. 10 is a block diagram of a system for generating Steiner tree solutions in accordance with one embodiment of the invention.

In one or more embodiments of the invention, and as illustrated in FIG. 10, the computer 100 includes a system 150 for generating all "n"-segment Steiner trees. The system 150 may be connected to the CPU 113 of the computer 100.

In one embodiment, the system 150 includes a Boolean function generator 152. In one or more embodiments, the generator 152 performs step S1 of the method illustrated in FIG. 1, and steps S101–S105 of the method illustrated in FIG. 2. The system 150 also includes a binary decision diagram generator 154 which generates the binary decision diagram of the Boolean function generated by the Boolean function generator 152, including the vertices of one or more nodes thereof, in accordance with steps S201–S202 of FIG. 2. A solution generator 158 selects path(s) through the binary decision diagram as described in detail in conjunction with steps S203 of FIG. 2 and generates the solution(s) in accordance with steps S2 and S3 of FIG. 1.

As will be appreciated by those of skill in the art, there are a wide variety of configuration for hardware and software for accomplishing the method of the invention other than that described above.

Of course, the foregoing description is that of preferred embodiments of the invention, and various changes and modifications may be made without departing from the spirit and scope of the invention, as defined by the claims.

What is claimed is:

1. In a computer system, a method of generating a Steiner tree for connecting at least two points comprising:
   generating a Boolean network function representing a network of interconnects, each interconnect having as an end point one of said at least two points;
   determining a binary decision diagram for said Boolean network function; and
   determining a solution for said Steiner tree by determining solution values for said Boolean network function from said binary decision diagram.

2. The method in accordance with claim 1 wherein said binary decision diagram includes a root and at least one variable node, and including the step of determining a number of vertices corresponding to at least one variable node of said binary decision diagram.

3. The method in accordance with claim 2 including the step of selecting a path from said root to at least one variable node of said binary decision diagram and wherein said step of determining solution values comprises determining said values in accordance with said selected path.

4. The method in accordance with claim 1, including the step of generating individual Boolean interconnect functions for interconnects corresponding to each point to be connected, and wherein said Boolean network function is generated from said individual Boolean interconnect functions.

5. The method in accordance with claim 4 wherein said individual Boolean interconnect functions represent an interconnect having "n" segments.

6. The method in accordance with claim 4 further including the steps of encoding a space containing said at least two points to be connected and wherein said individual Boolean interconnect functions represent an interconnect in said encoded space.

7. The method in accordance with claim 1 including the step of generating said Boolean network function so that said network of interconnects connect at a joint.

8. The method in accordance with claim 7 including the step of determining a solution value for the joint.

9. The method in accordance with claim 4 including the step of modifying said individual Boolean interconnect functions to include constraining criteria.

10. The method in accordance with claim 9 wherein said constraining criteria comprises an obstacle to be avoided by an interconnect.

11. A computer program product comprising:
    a computer usable medium having computer readable program code embodied therein for generating a Steiner tree connecting at least two points comprising:

computer readable program code configured to cause a computer to generate a Boolean network function representing a network of interconnects, each interconnect having as an end point one of said at least two points;

computer readable program code configured to cause a computer to determine a binary decision diagram for said Boolean network function; and computer readable program code configured to cause a computer to determine a solution for said Steiner tree by determining solution values for one or more of said variables of said Boolean network function.

12. The computer program product in accordance with claim 11 further including computer readable program code configured to cause a computer to generate a binary decision diagram having a root and at least one variable node for said Boolean network function and to determine a number of vertices corresponding to at least one variable node of the binary decision diagram.

13. The computer program product in accordance with claim 11 including computer readable program code configured to cause a computer to determine a path through said binary decision diagram to determine said solution values.

14. The computer program product in accordance with claim 11 further including computer readable program code configured to cause a computer to encode a space in which said at least two points to be connected are positioned.

15. The computer program product in accordance with claim 11 wherein said computer readable program code is configured to cause a computer to generate said Boolean network function from individual Boolean interconnect functions for interconnects corresponding to each point to be connected.

16. The computer program product in accordance with claim 11 wherein said computer readable program code configured to cause a computer to generate a Boolean network function representing a network of interconnects having a common joint and configured to determine a solution for said joint.

17. A computer system comprising:

a processor;

a system for generating a Steiner tree connecting at least two points comprising:

a Boolean function generator for generating a Boolean network function representing a network of interconnects connecting said points to be connected;

a binary decision diagram generator for generating a binary decision diagram of said Boolean network function; and a solution generator for generating a Steiner tree solution based on a solution of said Boolean network function as determined from said binary decision diagram.

18. A system for generating a Steiner tree for connecting at least two points comprising:

means for generating a Bollean network function representing a network of interconnects, each interconnect having as an end point one of said at least two points;

means for determining a binary decision diagram for said Boolean network function; and means for determining a solution for said Steiner tree by determining solution values for said Boolean network function from said binary decision diagram.

19. The system in accordance with claim 18 including means for generating individual Boolean interconnect functions for interconnects corresponding to each point to be connected, said Boolean network function generated from said individual Boolean interconnect functions.

* * * * *